United States Patent [19]

Gariboldi et al.

[11] Patent Number: 4,786,827
[45] Date of Patent: Nov. 22, 1988

[54] ANTISATURATION CIRCUIT FOR INTEGRATED PNP TRANSISTOR WITH INTERVENTION CHARACTERISTIC DEFINABLE ACCORDING TO A PRESET FUNCTION

[75] Inventors: Roberto Gariboldi, Lacchiarella; Marco Morelli, Livorno, both of Italy

[73] Assignee: SGS Microelettronica S.p.A., Catania, Italy

[21] Appl. No.: 879,160

[22] Filed: Jun. 26, 1986

[30] Foreign Application Priority Data

Aug. 9, 1985 [IT] Italy ................................ 21900 A/85

[51] Int. Cl.[4] .......................... H03K 3/33; H03K 3/01; G05F 1/40
[52] U.S. Cl. .................................... 307/300; 307/297; 307/270; 323/289
[58] Field of Search ............... 307/297, 296, 300, 270, 307/270–273; 323/289

[56] References Cited

U.S. PATENT DOCUMENTS

| | | | |
|---|---|---|---|
| 3,697,860 | 10/1972 | Baker | 323/271 |
| 4,064,448 | 12/1977 | Eatock | 307/297 |
| 4,479,052 | 10/1984 | Suzki | 307/297 |

Primary Examiner—S. D. Miller
Assistant Examiner—B. P. Davis
Attorney, Agent, or Firm—Frost & Jacobs

[57] ABSTRACT

Described is an antisaturation circuit for an integrated PNP transistor characterized by a comparator circuit comprising two transistors and a current generator whose output current corresponds to a pre-established function, e.g., an exponential function, of the emitter current of said transistor. The changing of state of the comparator circuit, as determined by said pre-established function of said current generator, is determined by the drop of the $V_{CE}$ voltage of the transistor below a preset minimum value, with a portion of the conduction current of one of the two transistors of the comparator circuit utilized for increasing the forced $\beta$ of the transistor. This limits the degree of its saturation, as well as the leakage current toward the substrate.

6 Claims, 1 Drawing Sheet

ANTISATURATION CIRCUIT FOR INTEGRATED PNP TRANSISTOR WITH INTERVENTION CHARACTERISTIC DEFINABLE ACCORDING TO A PRESET FUNCTION

BACKGROUND OF THE INVENTION

The present invention concerns an antisaturation circuit for PNP transistors in monolithic integrated circuits. Such integrated circuits are formed on a single chip of semiconductor material, usually silicon, by a suitable sequence of fabrication stages comprising superficial oxidation, photolithography, epitaxial growth, diffusion of impurities, and metallizations. With these processes, diodes, transistors and passive components are formed and are interconnected on the chip itself by means of successive metallization and isolation layers.

Integrated PNP transistors formed on the semiconductor chip present, during their operation, a peculiar problem. Under certain conditions, when the PNP transistor is working in the saturation zone of its characteristic, it may give rise to a leakage current toward the substrate which may be intolerable for the correct operation of the whole integrated circuit. In saturation conditions, which occur with the substantial dropping to zero of the $V_{CE}$ voltage of the PNP transistor, its base may, for example, come to find itself at a lower potential than the potential of its collector making it possible for the base-collector junction to become forward biased. This gives rise to the creation of a "parasitic PNP transistor" through the base-collector junction of the real transistor, whose collector functions as the "emitter" of the "parasitic transistor", the "collector" is represented by the substrate of semiconductor material of the chip.

Naturally, this problem is particularly felt in the case of integrated PNP power transistors because of the magnitude of the currents, as well as the increased probability that such transistors might be driven accidentally into their zone of saturation with the variation of the load impedance of the transistor.

In Italian patent application No. 21272 A/85, filed on June 24, 1985, by the present applicant, SGS-MICROELETTRONI CA S.p.A., a simple and effective antisaturation circuit was proposed in order to limit the degree of saturation of an integrated PNP transistor and therefore of the leakage current toward the substrate.

Nevertheless, such a circuit does not lend itself to predisposing a specific characteristic of intervention, as is often desirable in certain applications of PNP power transistors.

SUMMARY OF THE INVENTION

It is therefore an object of the present invention to provide an antisaturation circuit for an integrated PNP transistor which prevents appreciable leakage currents toward the substrate and intervenes according to a certain preset characteristic.

These objectives and other advantages are obtained by means of the antisaturation circuit of the invention, which is easily integrated in the chip containing the PNP transistor. The PNP transistor should not saturate, or at least not too deeply, upon the happening of conditions which otherwise would give rise to severe saturation with intolerable leakage currents toward the substrate.

The circuit of the present invention for preventing or limiting saturation of an integrated PNP transistor is characterized by a comparator circuit comprising at least two transistors and at least one generic current generator, capable of determining a maximum preset threshold current through itself and therefore through the conducting transistor of said comparator circuit, and a regulation resistor R, connected between the emitter if said PNP transistor and said at least one generator supplying a variable current which is a preset function of the emitter current of said PNP transistor. The comparator circuit changes state when the condition given by the following relation takes place:

$$V_{CE} \leq \Delta V$$

$V_{CE}$ is the collector-emitter voltage of the PNP transistor and $\Delta V$ is a voltage drop across said resistor R determined by the passage through R of a current which is the sum of a preset constant current and said variable current generated by said generator. The change of state of the comparator circuit, characterized by said preset function, determines the increasing conduction of the transistor of said comparator circuit. Under normal working conditions of the PNP transistor, the comparator circuit is cut-off, means for increasing the forced $\beta$ of the PNP transistor and therefore for decreasing the leakage current toward the substrate is driven by the conduction current of said transistor of the comparator circuit which exceeds the maximum threshold current preset by said current generator.

Generally, said means for increasing the forced $\beta$ comprise a NPN transistor, which is purposely connected between the base of a NPN transistor driving the PNP transistor and ground. The conduction current of the transistor of the comparator circuit brought to conduction which exceeds the threshold current preset by the generic current generator, is fed to the NPN transistor used for increasing the forced $\beta$.

The antisaturation circuit of the invention is particularly suitable to be used for power PNP transistors utilized as regulators.

In fact, the antisaturation circuit of the invention allows the realization of an intervention characteristic based upon an exponential function of the input current to the regulator. This permits a relatively high $\Delta V_{CE}/\Delta I_o$ to be obtained through the regulation of the PNP transistor at large input currents and, vice versa, a relatively small $\Delta V_{CE}/\Delta I_o$ at small input currents.

BRIEF DESCRIPTION OF THE DRAWING

With the aim of better illustrating the invention, the description refers to the annexed FIGS. 1 and 2 depicting electric diagrams representative of two different, particularly preferred, practical embodiments of the invention as applied to the case of a voltage regulator.

DESCRIPTION OF THE PREFERRED EMBODIMENTS

Figure 1:
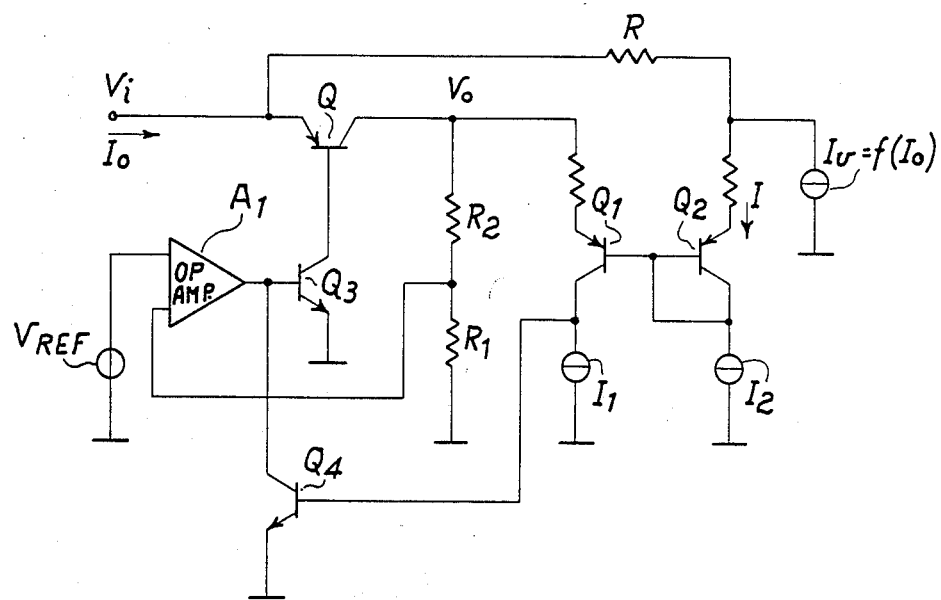

FIG. 1 shows an integrated voltage regulator which utilizes a PNP transistor, Q, as a series regulator driven by a NPN transistor, Q3. The NPN transistor in turn is driven by an operational amplifier, A1, which compares a voltage representative of the output voltage of the regulator, $V_o$ (detected through the voltage divider formed by the two resistors $R_1$ and $R_2$), with a reference voltage, $V_{REF}$. The eventual difference between the two voltages generates a suitable correction signal which, when applied to the base of the driver transistor Q3, regulates the voltage drop ($V_{CE}$) through the transistor Q in a way that the regulated outpt voltage is:

$$V_{CE}=(1+(R_2/R_1))V_{REF}$$

During operation of this classical type of integrated regulator, saturation conditions may arise leading to a certain input current $_o$ (emitter current of transistor Q) a corresponding output current (collector current of transistor Q), the output current being only a fractional portion of the input current. The greater portion of the input current is pulled toward the substrate while the remaining portion is pulled toward the base.

In particular, this operation may take place under conditions absent of load, e.g., with a collector current on the order of about 500 μA and an input voltage $V_i$ less than the value for the regulation of the output voltage $V_o$. In these circumstances, transistors Q finds itself forced to work under conditions of strong imbalance insofar as an extremely low forced $\beta$ is imposed on it, since the regulation loop imposes a relatively large base current anyway (on the order of about 50 mA). Under these conditions, a large portion of the input current is lost toward the substrate.

With the aim of avoiding such an occurrence, the antisaturation circuit of the invention utilizes a comparator circuit comprising two PNP transisstors, Q1 and Q2. These PNP transistors are connected as shown in FIG. 1 and have two constant current generators, $I_1$ and $I_2$, preferably both generating a current equal to I over the respective collectors. A variable current generator, $I_v$, whose generated current is a preset function of the input (emitter) current $I_o$ of transistor Q, is also connected to the PNP transistors.

Under normal operating conditions, i.e., when the series regulator Q is working and the input voltage $V_i$ is substantially greater than the regulated output voltage $V_o$, transistor Q1 is maintained in an off position. This is preferred because Q2 conducts when it has on its emitter a voltage much higher than $V_o$, the output voltage being equal to the input voltage $V_i$ less the voltage drop across the regulation resistor R (generally equal to a few hundred millivolts).

In case the variable current generator $I_v$ is preset to output a current equivalent to an exponential function of the input current $I_o$, the current given out will be:

$$I_v=K_1 \exp(I_o/K_2)$$

where $K_1$ and $K_2$ are constants which depend from said exponential correction circuit. The voltage drop across R, then, will be:

$$\Delta V=R[I+I_v]=R[I+K_1 \exp(I_o/K_2)]$$

Therefore, when the voltage $V_i$-$V_o$ ($V_{CE}$ of transistor Q) tends to fall below this value, the comparator stage changes state and Q1 conducts.

When the conduction current of transistor Q1 exceeds the threshold value I, determined by the respective constant current generator, current is supplied to the base of transistor Q4. This drives transistor Q4 to conduction and subtracts current from the base of the driver transistor Q3, thus increasing the forced $\beta$ of transistor Q and reducing the leakage current toward the substrate.

In other words, a certain minimum $V_{CE}$ is imposed to transistor Q, as determined by the voltage drop created across the regulation resistor R when a constant current, I, and a variable current (corresponding to a certain function of the input current $I_o$ to the regulator), $I_v$, is imposed through R.

In this way, it is possible to optimize the characteristic of the voltage drop of the regulator as a function of the level of the input current $I_o$ to the regulator. In this type of application, an exponential-type characteristic is particularly preferred because it determines high $\Delta V_{CE}/\Delta I_o$ at high levels of input current and low $\Delta V_{CE}/\Delta I_o$ at low levels of input current.

Figure 2:
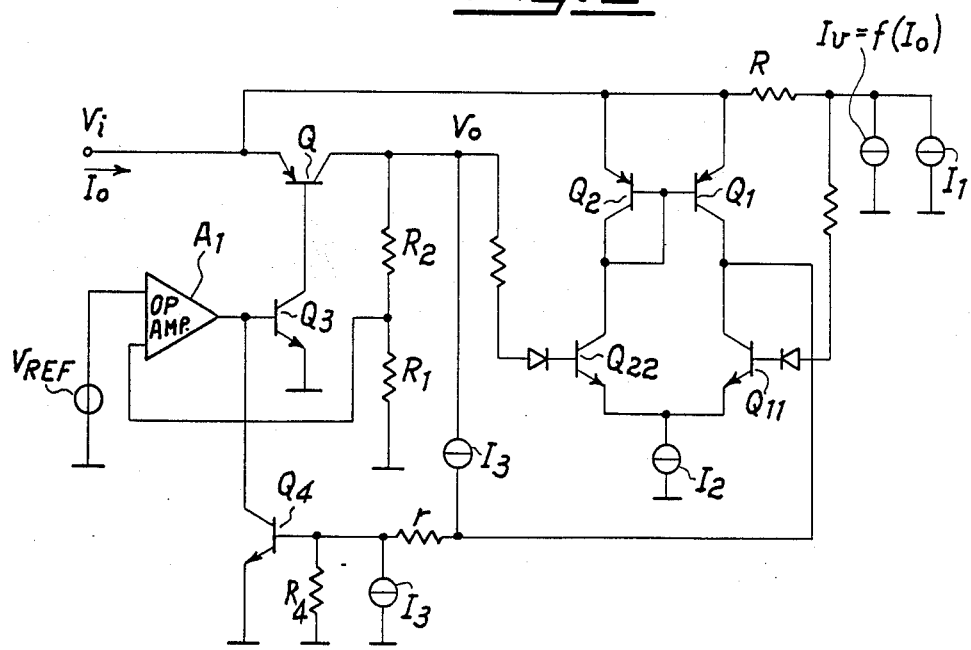

FIG. 2 shows an integrated voltage regulator similar to that of FIG. 1, wherein similar components are indicated with the same numbers used in FIG. 1. The object of the antisaturation circuit in this embodiment, however, is made by utilizing two NPN transistors ($Q_{11}$ and $Q_{22}$) in the comparator circuit.

The operation of the circuit is as follows. Neglecting the base current of transistor $Q_{11}$ (in any case much smaller than $I_1$ and $I_v$), the potential difference across the regulation resistor R is given by the following equation:

$$\Delta V=R(I_1+I_v)=R[I_1+f(I_o)],$$

where $f(I_o)$ is a pre-established function of the input current $I_o$.

When $V_i>V_o+\Delta V$, the comparator, comprising transistors $Q_{11}$, $Q_{22}$, $Q_1$ and $Q_2$, does not feed any current to transistor $Q_4$. The comparator therefore does not subtracting current from the driver transistor Q3 of transistor Q in this instance.

Whenever the condition $V_i \leq V_o+\Delta V$ (or $V_{CE} \leq \Delta V$) takes place, the comparator changes state and $Q_{22}$, $Q_2$ and $Q_1$ conduct. The conduction current output by $Q_{22}$, $Q_2$ and $Q_1$ exceeding the threshold established by $V_{BEQ4}/R_4$ is fed to the base of $Q_4$, which drives it into conduction. Thus, current is subtracted from the base of Q3 and the forced $\beta$ of Q is increased, which prevents or reduces the leakage of current toward the substrate.

The two current generators, $I_1$ and $I_v$, current generator $I_3$, and the resistor r consitute a voltage shifter for rendering the output dynamics of the comparator compatible with transistor $Q_4$.

Though the invention has been described with reference to the electric diagrams of the two particularly preferred, practical embodiments containing herein, it is understood that variations and modifications of such diagrams may be made by the expert technician while remaining within the scope and spirit of the invention as defined in the annexed claims.

What I claim is:

1. An antisaturation circuit for an integrated PNP transistor having an extremely low DC current gain under conditions of strong imbalance, wherein said circuit comprises a comparator circuit formed by at least two transistors and at least a first generic current generator capable of determining a pre-established maximum threshold current through itself and therefore through the conducting transistor of said comparator circuit;

a regulation resistor connected between an emitter of said PNP transistor and at least a second generator supplying a variable current the intensity of which corresponds to a pre-established function of a current passing through said emitter of said PNP transistor;

said comparator circuit comparing a collector voltage of said PNP transistor and a voltage drop across said regulation resistor determined by the passage throiugh said resistor of an electric current which is the sum of a preset constant current and of said variable current generated by said second current generator and said comparator circuit changing state when $$V_{CE} \leq \Delta V$$

where $V_{CE}$ is the collector voltage of said PNP transistor and $\Delta V$ is the voltage drop across said regulation resistor;

means, driven by a portion of the conduction current of the one of said two transistors forming said comparator circuit which is made conducting upon said changing of state of the comparator circuit, for increasing the DC current gain of said PNP transistor, thus reducing the degree of saturation thereof.

2. An antisaturation circuit for an integrated PNP transistor having an extremely low DC current gain under conditions of strong imbalance, said PNP transistor including an emitter, a base and a collector, wherein said circuit comprises:

a comparator circuit formed by a second and third PNP transistor, each having an emitter, a base and a collector, and each having independent constant current generators connected between respective collectors of said second and third PNP transistor and ground, the bases of said second and third transistors being connected in common and to the collector of said third PNP transistor;

a variable current generator generating a current the intensity of which corresponds to a pre-established function of a current passing through the emitter of said integrated PNP transistor;

the collector of said integrated PNP transistor being connected through a first load resistor to the emitter of said second PNP transistor;

the emitter of said integrated PNP transistor being connected through a regulation resistor to both said variable current generator and, through a second load resistor, to the emitter of said third PNP transistor;

said comparator circuit comparing a collector voltage of said integrated PNP transistor and a voltage drop across said regulation resistor determined by the passage through said regulation resistor of current which is the sum of a preset constant current and of said variable current generated by said variable current generator, and said comparator circuit changing state when $$V_{CE} \leq \Delta V$$

where $V_{CE}$ is the collector voltage of said integrated PNP transistor and $\Delta V$ is the voltage drop across said regulation resistor;

means, driven by a portion of the conduction current of said second PNP transistor forming said comparator circuit and which is made conducting upon said changing of state of the comparator circuit, for increasing the DC current gain of said integrated PNP transistor, thus reducing the degree of saturation thereof.

3. The antisaturation circuit of claim 2, wherein the portion of the conduction current of said second PNP transistor exceeding a fixed current generated by the respective independent constant current generator connected to the collector of said second PNP transistor is fed to a base of a NPN transistor having an emitter connected to ground and a collector connected to a base of a second NPN transistor driving said integrated PNP transistor.

4. The antisaturation circuit iof claim 1, wherein said variable current generator outputs a current the intensity of which is an exponential function of the emitter current of said integrated PNP transistor.

5. An integrated voltage regulator utilizing a first PNP transistor as a series regulator, said PNP transistor having an extremely low DC current gain under conditions of strong imbalance, and having a regulation loop comprising an operational amplifier for comparing the output or collector voltage of said first PNP transistor with a reference voltage and consequently regulating the current through a base of a NPN driver transistor of said first PNP transistor, said regulator comprising:

a comparator circuit formed by a second and a third PNP transistor, each having an emitter, a base and a collector, and each having a constant current generator connected between the collector and ground, the base of each of said second and third PNP transistor being connected in common and to the collector of said third PNP transistor;

a variable current generator the output of which is a pre-established function of the input or emitter current of said first PNP transistor;

the output of said series regulator being connected, through a first load resistor to the emitter of said second PNP transistor, the input of said series regulator being connected through a regulation resistor to both said variable current generator and, through a second load resistor, to the emitter of said third PNP transistor;

said comparator circuit comparing collector voltage, or $V_{CE}$, of said integrated PNP transistor and a voltage drop, or $\Delta V$, across said regulation resistor determined by the passage through said resistor of current which is the sum of a preset constant current and of said variable current generated by said variable current generator and said comparator circuit changing state when $$V_{CE} \leq \Delta V;$$

means driven by a portion of the conduction current of said second PNP transistor forming said comparator circuit which is made conducting upon said changing of state of the comparator circuit, for increasing the DC current gain of said integrated PNP transistor to prevent it from being driven into saturation.

6. The voltage regulator of claim 5, wherein said variable current generator outputs a current which is an exponential function of the input current of said voltage regulator.

* * * * *